(12) United States Patent
Zhang

(10) Patent No.: US 9,754,947 B2
(45) Date of Patent: Sep. 5, 2017

(54) STATIC RANDOM ACCESS MEMORY AND FABRICATION METHODS THEREOF

(71) Applicant: Semiconductor Manufacturing International (Shanghai) Corporation, Shanghai (CN)

(72) Inventor: Gong Zhang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/445,948

(22) Filed: Jul. 29, 2014

(65) Prior Publication Data
US 2015/0206888 A1    Jul. 23, 2015

(30) Foreign Application Priority Data

Jan. 20, 2014  (CN) .......................... 2014 1 0025102

(51) Int. Cl.
*H01L 27/11*    (2006.01)
*H01L 27/02*    (2006.01)

(52) U.S. Cl.
CPC ...... *H01L 27/1104* (2013.01); *H01L 27/0207* (2013.01)

(58) Field of Classification Search
CPC .. H01L 27/11; H01L 27/1104; H01L 27/0207; H01L 27/105; H01L 27/1116
See application file for complete search history.

(56) References Cited

U.S. PATENT DOCUMENTS

| | | | |
|---|---|---|---|
| 2005/0124095 A1* | 6/2005 | Liaw ....................... | H01L 23/50 438/128 |
| 2005/0253287 A1* | 11/2005 | Liaw ....................... | G11C 8/16 365/230.05 |
| 2006/0038234 A1* | 2/2006 | Liaw ....................... | G11C 8/16 257/368 |
| 2006/0101366 A1* | 5/2006 | Moldovan ........... | G06F 17/5068 365/63 |
| 2007/0002617 A1* | 1/2007 | Houston ............... | G11C 11/412 365/185.07 |
| 2008/0019171 A1* | 1/2008 | Liaw ....................... | G11C 11/412 365/174 |
| 2008/0099812 A1* | 5/2008 | Nagata ................. | H01L 27/105 257/298 |
| 2008/0121942 A1* | 5/2008 | Liaw ..................... | H01L 27/105 257/211 |
| 2009/0067222 A1* | 3/2009 | Kawasumi ............ | G11C 11/412 365/156 |
| 2011/0241121 A1* | 10/2011 | Kwon ..................... | H01L 27/11 257/369 |

(Continued)

*Primary Examiner* — Jaehwan Oh
(74) *Attorney, Agent, or Firm* — Anova Law Group, PLLC

(57) ABSTRACT

A method for fabricating a static random access memory is provided. The method includes providing a semiconductor substrate. The method also includes forming a plurality of transistors on the semiconductor substrate. Further, the method includes forming a first metal layer having a word line electrically connecting with a partial number of the transistors. Further, the method also includes forming a second metal layer having a first bit line, a second bit line, a first power source line and second power source lines electrically connect with a partial number of the transistors.

18 Claims, 6 Drawing Sheets

(56) References Cited

U.S. PATENT DOCUMENTS

2012/0187504 A1\* 7/2012 Igarashi ............ H01L 21/76895
　　　　　　　　　　　　　　　　　　　　257/390
2014/0185365 A1\* 7/2014 Liaw ........................ G11C 8/16
　　　　　　　　　　　　　　　　　　　　365/154
2014/0299941 A1\* 10/2014 Paul .................... H01L 27/1104
　　　　　　　　　　　　　　　　　　　　257/401

\* cited by examiner

US 9,754,947 B2

STATIC RANDOM ACCESS MEMORY AND FABRICATION METHODS THEREOF

CROSS-REFERENCES TO RELATED APPLICATIONS

This application claims the priority of Chinese patent application No. 201410025102.9, filed on Jan. 20, 2014, the entirety of which is incorporated herein by reference.

FIELD OF THE INVENTION

The present invention generally relates to the field of semiconductor technology and, more particularly, relates to static random access memories and fabrication methods thereof.

BACKGROUND

In applications of large scale integrations (LSIs), static random access memory (SRAM) are the widely-used on-chip memory. Unlike dynamic random access memories (DRAM), it may only need to supply power to SRAM for storing data, and it may be unnecessarily to refresh the SRAM. Therefore, SRAM may have advantages including high speed and low power consumption, etc.

FIG. 1 illustrates a circuit structure of an existing SRAM, which may have six transistors (6T SRAM). As shown in FIG. 1, the 6T SRAM may include a first pull-up PMOS transistor PU1, a second pull-up PMOS transistor PU2, a first pull-down NMOS transistor PD1 and a second pull-down NMOS transistor PD2. Sources of the first pull-up PMOS transistor PU1 and the second pull-up PMOS transistor PU2 may connect with a power source $V_{dd}$. Sources of the first pull-down NMOS transistor PD1 and the second pull-down NMOS transistor PD2 may connect with a ground Vss. The first pull-up PMOS transistor PU1 and the first pull-down NMOS transistor PD1 may form a first inverter. The second pull-up PMOS transistor PU2 and the second pull-down NMOS transistor PD2 may form a second inverter. The output of the first inverter may electrically connect with the input of the second inverter, and a first storage node Q may be formed. The input of the second inverter may electrically connect with the output of the first inverter, and a second storage node QN may be formed.

Because the first inverter and the second inverter may have a cross-coupling effect, a latch circuit may be formed. When one storage node is pulled down to a lower potential, the other storage node may be pulled up to a higher potential. The first storage node Q may connect with a first transfer gate PG1. The second storage node QN may connect with a second transfer gate PG2. The first transfer gate PG1 and the second transfer gate PG2 may connect with a word line WL.

When the word line WL is switched to a system high potential, the first transfer gate PG1 and the second transfer gate PG2 may be turned on, and a first bit line BL1 and a second bit line BL2 may be allowed to write data into the first storage node Q and the second storage node QN, or to read data from the first storage node Q and the second storage node QN. When the word line WL is switched to a system low potential, the first transfer gate PG1 and the second transfer gate PG2 may be turned off, the first bit line BL1 and the second bit line BL2 may be isolated from the first storage node Q and the second storage node QN.

However, the fabrication of the existing STRAM structures may be relatively complex. The disclosed device structures and methods are directed to solve one or more problems set forth above and other problems.

BRIEF SUMMARY OF THE DISCLOSURE

The present disclosure includes a method for fabrication a random access memory. The method includes providing a semiconductor substrate. The method also includes forming a plurality of transistors on the semiconductor substrate. Further, the method includes forming a first metal layer having a word line electrically connecting with a partial number of the transistors. Further, the method also includes forming a second metal layer having a first bit line, a second bit line, a first power source line and second power source lines electrically connect with a partial number of the transistors.

Another aspect of the present disclosure includes a static random access memory. The static random access memory includes a semiconductor substrate; and a plurality of transistors formed on the semiconductor substrate. The random access memory also includes a first metal layer having a word line electrically a partial number of transistors. Further, the random access memory includes a second metal layer having a first bit line, a second bit line, a first power source line and second power source lines electrically connecting with a partial number of the transistors.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 2:
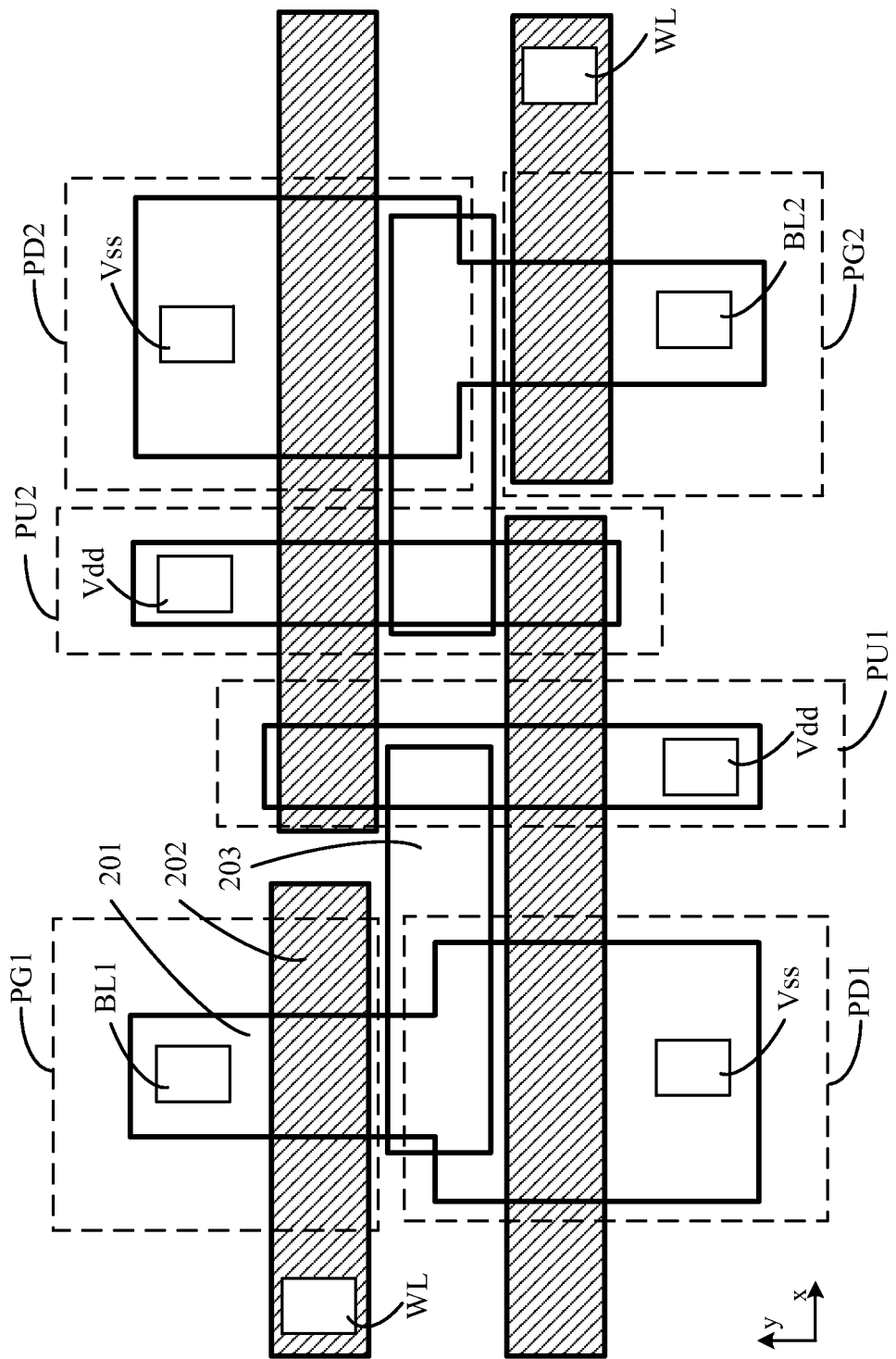
FIG. 2 illustrates a layout-design of the existing static random access memory.

FIG. 2 illustrates the layout-design of an existing 6T random access memory (6T SRAM); and the layout-design illustrates a layout of an active region 201, a gate 202 and a metal structure 203.

As shown in FIG. 2, the 6T SRAM may include a first pull-up transistor PU1, a second pull-up transistor PU2, a first pull-down transistor PD1, a second pull-down transistor PD2, a first transfer transistor PG1 and a second transfer transistor PG2. The first pull-up transistor PU1 and the first pull-down transistor PD1 may share a same gate 203; and the second pull-up transistor PU2 and the second pull-down transistor PD2 may share a same gate (not labeled). Further, the first transfer transistor PG1 and the first pull-down transistor PD1 may be in a same active region; and the second transfer transistor PG2 and second pull-down transistor PD2 may be in a same active region. Further, a first storage node (not labeled) may be formed by electrically connecting the drain of the first pull-up transistor PU1, the drain of the first pull-down transistor PD1 and the first port of the first transfer transistor PG1; and a second storage node (not labeled) may be formed by electrically connecting the drain of the second pull-up transistor PU2, the drain of the second pull-down transistor PD2 and the first port of the second transfer transistor PG2.

Figure 3:
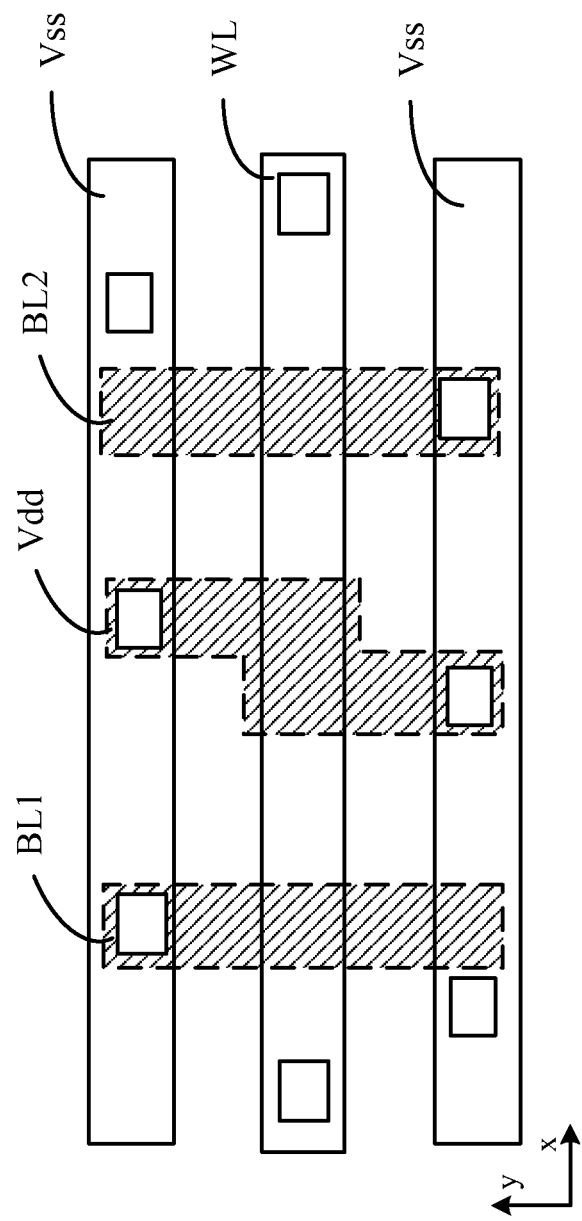
FIG. 3 illustrates a layout-design of the first metal layer and the second metal layer of an existing static random access memory.

FIG. 3 illustrates a layout-design of the first metal layer and the second metal layer of an existing SRAM. Referring to FIG. 2 and FIG. 3, the first metal layer (the shadowed region, not labeled) may be used to form the first bit line BL1, the second bit line BL2, and the first power source line Vdd. The first bit line BL1 may connect with the second port of the first transfer transistor PG1 by a conductive via penetrating through the interlayer dielectric layer; and the second bit line BL2 may connect with the second port of the second transfer transistor PG2 by a conductive via penetrating through the interlayer dielectric layer. Further, the first power source line Vdd may connect with the source of the first pull-up transistor PU1 and the source of the second pull-up transistor PU2 by a conductive via through the interlayer dielectric layer.

Further, referring FIG. 2 and FIG. 3, the second meal layer (the enclosed blank region, not labeled) may be used to form the word line WL and the second power source line Vss. The word line WL may connect with the gate of the first transfer transistor PG1 and the gate of the second transfer transistor PG2 by a conductive via through the interlayer dielectric layer. Further, the second power source line Vss may connect with the source of the first pull-down transistor PD1 and the source of the second pull-down transistor PD2 by a conductive via through the interlayer dielectric layer.

As shown in FIG. 3, the first bit line BL1, the second bit line BL2, and the first power source line Vdd in the first metal layer may extend along the y-axis direction. The word line WL and the second power source line Vss may extend along the x-axis direction. However, being limited by the layout of the semiconductor structures under the first metal layer and the second metal layer, the layout of the mask may have significantly high requirements for the fabrication process of the first metal layer and the second metal layer, especially for the first metal layer. For example, in the SRAMs with a 20 nm technology node, the minimum feature size of the patterns in the first metal layer may be only approximately 0.0039 $\mu m^2$. Such a feature size may be way beyond the capability of the state-of-the-art fabrication process. Further, the layout of the first metal layer and the second metal layer may cause the pitch of the patterns in the second metal layer to be substantially small. For example, in the SRAMs with a 20 nm technology node, the minimum pitch of the patterns may be only approximately 88 nm. Such a small pitch may also beyond the capability of a single patterning process.

Therefore, the layout of the first metal layer and the second metal layer of the existing SRAM may increase the difficulty of the photolithography process, and the fabrication process of the SRAM may be complex. According to the disclosed device structures and methods, the complexity for forming SRAMs and related issues may be overcome by changing the layout-design of the SRAMs.

Figure 4:
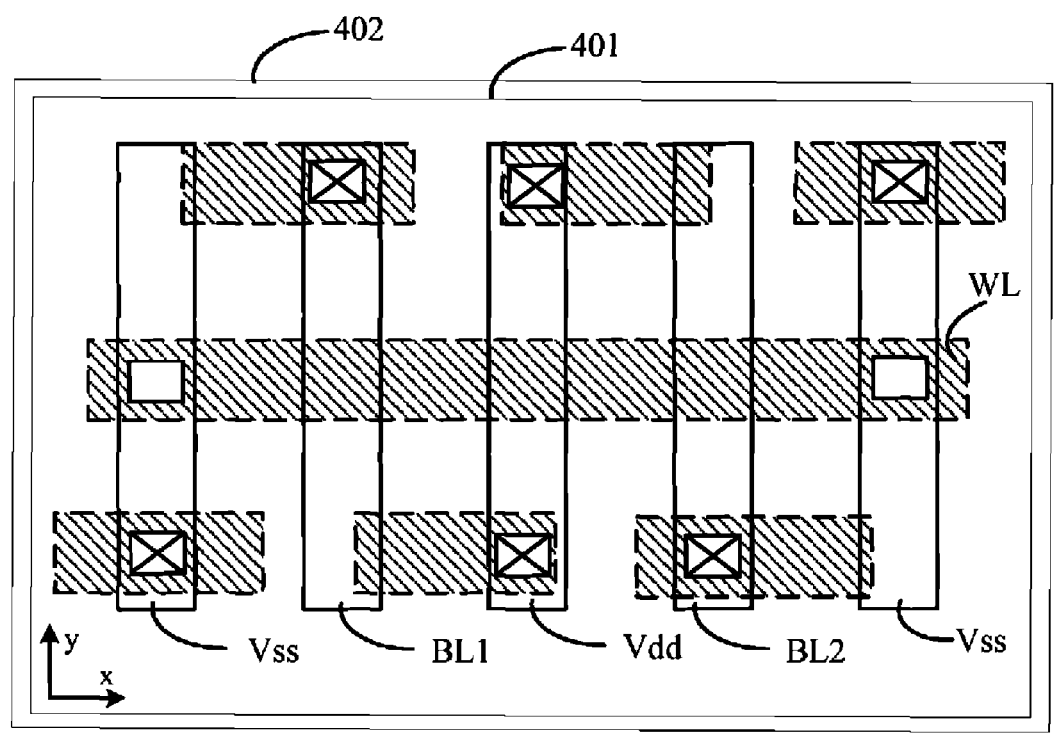
FIG. 4 illustrates a layout-design of the first metal layer and the scone metal layer of a static random access memory consistent with the disclosed embodiments.
Figure 5:
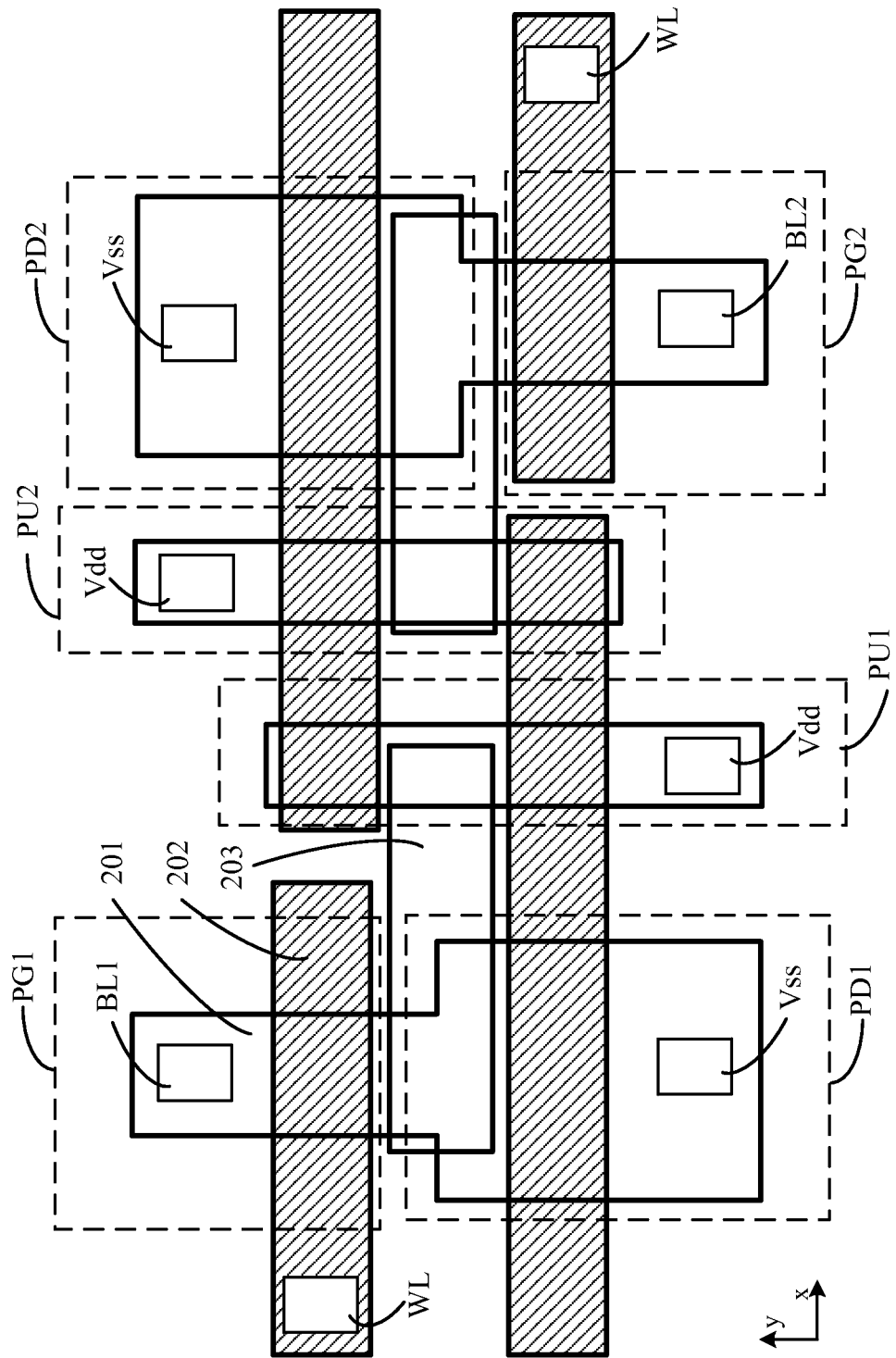
FIG. 5 illustrates a layout-design of the static random access memory consistent with the disclosed embodiments.
Figure 6:
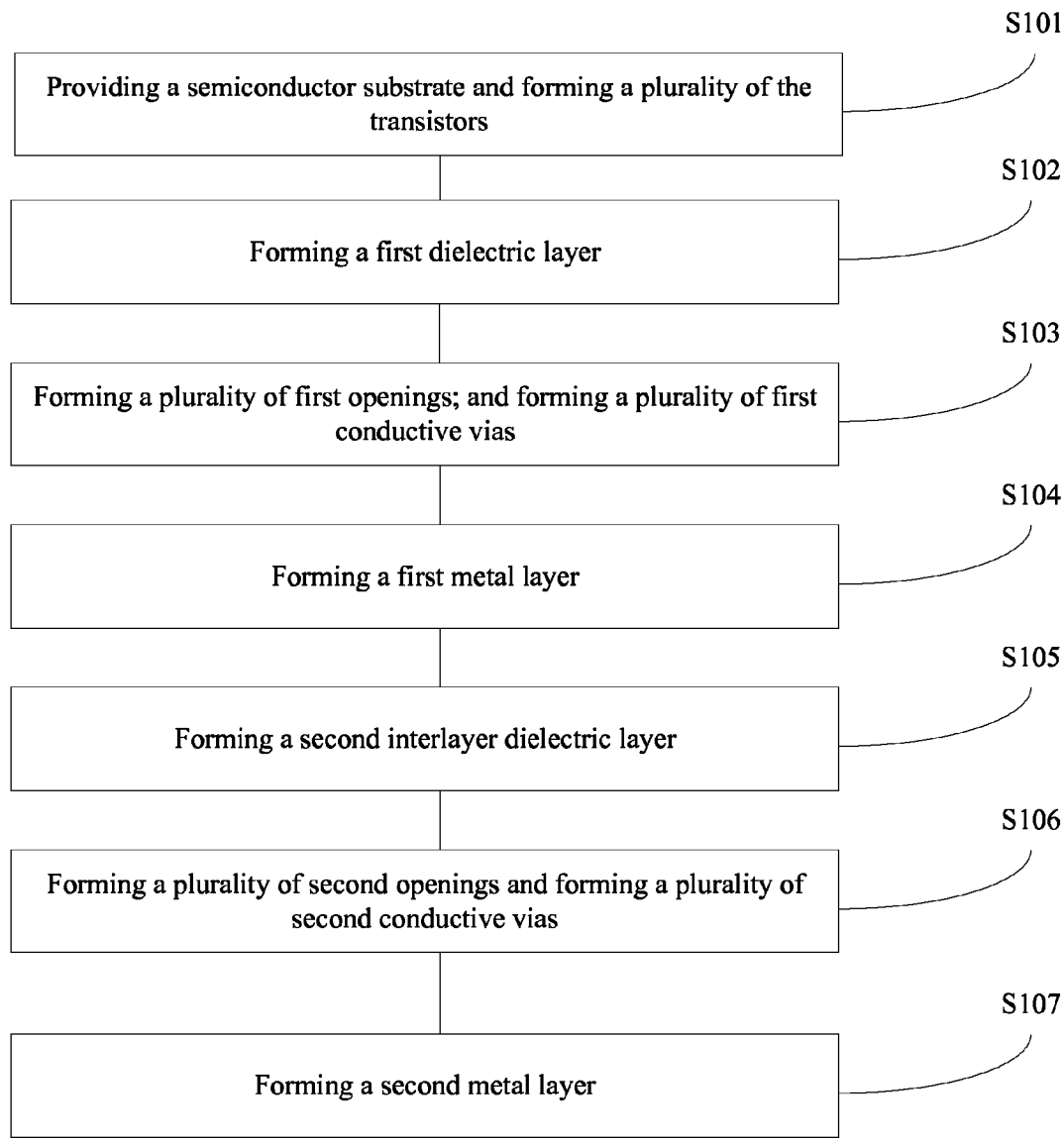
FIG. 6 illustrates an exemplary process of a static random access memory consistent with the disclosed embodiments.

FIG. 6 illustrates an exemplary fabrication process of a SRAM consistent with the disclosed embodiments; and FIGS. 4-5 illustrate semiconductor structures corresponding to certain stages of the exemplary fabrication process consistent with the disclosed embodiments.

As shown in FIG. 6, at the beginning of the fabrication process, a semiconductor substrate is provided; and a plurality of transistors are formed on the semiconductor substrate (S101). A corresponding semiconductor structure may refer to FIG. 5.

As shown in FIG. 5, a semiconductor substrate (not labeled) is provided. The semiconductor substrate may include any appropriate semiconductor materials, such as silicon, silicon on insulator (SOI), germanium on insulator (GOI), silicon germanium, carborundum, indium antimonide, lead telluride, indium arsenide, indium phosphide, gallium arsenide, gallium antimonite, or alloy semiconductor, etc. The semiconductor substrate provides a base for subsequent processes and structures.

Further, as shown in FIG. 5, in one embodiment, a first pull-up transistor PU1, a first pull-down transistor PD1, a second pull-up transistor PU2, a second pull-down transistor PD2, a first transfer transistor PG1 and a second transfer transistor may be formed on the semiconductor substrate. In certain other embodiments, other appropriate number of transistors may be formed on the semiconductor substrate to form a SRAM.

The gate of the first pull-up transistor PU1 and the gate of the first pull-down transistor PD1 may electrically connect. The gate of the second pull-up transistor PU2 and the second pull-down transistor PD2 may electrically connect. Further, the first port of the first transfer transistor PG1 may electrically connect with the drain of the first pull-up transistor PU1 and the drain of the first pull-down transistor PD1; and the first port of the second transfer gate PG2 may electrically connect with the drain of the second pull-up transistor PU2 and the drain of the second pull-down transistor PD2.

The first pull-up transistor PU1, the first pull-down transistor PD1, the second pull-up transistor PU2, the second pull-down transistor PD2, the first transfer transistor PG1 and the second transfer transistor PG3 may be any appropriate types. In one embodiment, the first pull-up transistor PU1 and the second pull-up transistor PU2 are PMOS transistors; the first pull-down transistor PD1, the second pull-down transistor are PD2, the first transfer transistor PG1 and the second transfer transistors PG2 are NMOS transistors.

In one embodiment, the first pull-up transistor PU1 and the first pull-down transistor PD1 may share a same gate. The second pull-up transistor PU2 and the second pull-down transistor may also share a same gate. That is, the gate of the first pull-up transistor PU1 and the gate of the first pull-down transistor PD1 may be electrically connected by a connect structure; and the gate of the second pull-up transistor PU1 and the gate of the second pull-down transistor PD2 may be electrically connected by a connect structure.

The connect structure may be made of any appropriate materials. In one embodiment, the connect structure is made of poly-silicon, or metal including Al, or Cu, etc.

In one embodiment, the first transfer transistor PG1 and the first pull-down transistor PD1 may be in a same active region; and the second transfer transistor PG2 and the second pull-down transistor PD2 may be in a same active region. Such a configuration may cause the first port of the first transfer gate PG1 and the drain of the first pull-up transistor PU1 to electrically connect; and the first port of the second transfer gate PG2 and the drain of the second pull-up transistor PU2 to electrically connect. As used herein, the first port of the first transfer transistor PG1 and the first port of second transfer transistor PG2 may refer to a source or a drain of the first transfer transistor PG1 and the second transfer transistor PG2, respectively.

Further, the drain of the first pull-up transistor PU1 and the drain of the first pull-down transistor PD1 may be electrically connected by a metal interconnect structure 203 to form a first storage node (not labeled); and the drain of the second pull-up transistor PU2 and the drain of the second pull-down transistor PD2 may also be electrically connected by an interconnect structure (not labeled) to form a second storage node (not labeled). The first storage node and the second storage node may be configured to store data.

The first pull-up transistor PU1, the second pull-up transistor PU2, the first pull-down transistor PD1, the second pull-down transistor PD2, the first transfer transistor PG1 and the second transfer transistor PG2 may be formed by any appropriate process and method. The interconnect structure may be made of any appropriate material, such as poly silicon, or metal, etc.

Returning to FIG. 6, after providing the semiconductor substrate; and forming the first pull-up transistor PU1, the second pull-up transistor PU2, the first pull-down transistor PD1, the second pull-down transistor PD2, the first transfer transistor PG1 and the second transfer transistor PG2, a first interlayer dielectric layer may be formed (S102). A corresponding semiconductor structure may refer to FIG. 4.

As shown in FIG. 4, a first interlayer dielectric layer 401 is formed. The first interlayer dielectric layer 401 may cover the first pull-up transistor PU1, the second pull-up transistor PU2, the first pull-down transistor PD1, the second pull-transistor PD2, the first transfer transistor PG1 and the second transfer transistor PG2.

The first interlayer dielectric layer 401 may be made of any appropriate material, such as silicon oxide, silicon nitride, silicon oxynitride, or low dielectric constant material (low-K), etc. Various processes may be used to form the first interlayer dielectric layer 401, such as a chemical vapor deposition (CVD) process, a physical vapor deposition (PVD) process, or a flowable CVD (FCVD) process, etc.

Returning to FIG. 6, after forming the first interlayer dielectric layer 401, a plurality of first openings (not labeled) may be formed (S103). A corresponding semiconductor structure may refer to FIG. 4.

The first openings may be formed in the first interlayer dielectric layer 401. The first openings may expose the gate of the first transfer transistor PG1 and the gate of the second transfer transistor PG2. Various processes may be used to form the first openings, such as a dry etching process, a wet etching process, or an ion beam etching process, etc.

Further, after forming the first openings, a first conductive via (not labeled) may be formed in each of the plurality of the first openings. A corresponding semiconductor structure may refer to FIG. 4. The first conductive vias may be through the first interlayer dielectric layer 401; and electrically connect with the gate of the first transfer transistor PG1 and the gate of the second transfer transistor PG2, respectively.

A process for forming the first conductive vias may include forming a conductive material in the first openings; and followed by a chemical mechanical polishing process, etc. The first conductive vias may be made of any appropriate material, such as Al, or Cu, etc. Various processes may be used to form the first conductive vias, such as a CVD process, a PVD process, or an electroplating process, etc.

In one embodiment, the first openings may also expose the second port of the first transfer transistor PG1, the second port of the second transfer transistor PG2, the source of the first pull-up transistor PU1, the source of the second pull-up transistor PU2, the source of the first pull-down transistor PD1 and the source of the second pull-down transistor PD2.

After forming the first conductive via in each of the first openings, the first conductive vias may also electrically connect with the second port of the first transfer transistor PG1, the second port of the second transfer transistor PG2, the source of the first pull-up transistor PU1, the source of the second pull-up transistor PU2, the source of the first pull-down transistor PD1 and the source of the second pull-down transistor PD2.

Therefore, a subsequently formed second metal layer connecting with some of the first conductive vias may electrically connect with the second port of the first transfer transistor PG1, the second port of the second transfer transistor PG2, the source of the first pull-up transistor PU1, the source of the second pull-up transistor PU2, the source of the first pull-down transistor PD1 and the source of the second pull-down transistor PD2.

Returning to FIG. 6, after forming the first conductive vias, a first metal layer (not labeled) may be formed (S104). A corresponding semiconductor structure may refer to FIG. 4.

Figure 1:
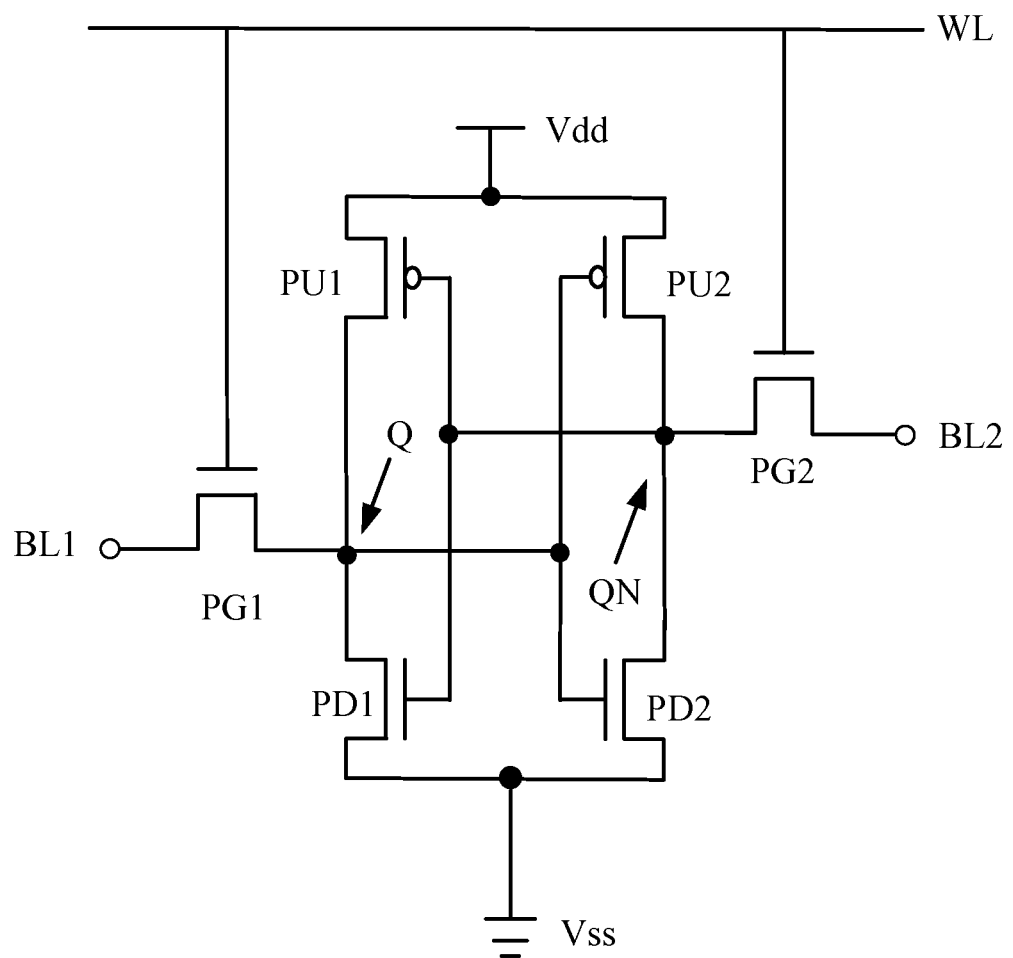
FIG. 1 illustrates a circuit structure of an existing static random access memory.

FIG. 4 illustrates a layout-design of the first metal layer and a subsequently formed second metal layer of the SRAM consistent with the disclosed embodiments. As shown in FIG. 4, the first metal layer (the shadowed region in the middle of FIG. 4, not labeled) may include a word line WL. The word line WL may electrically connect with the gate of the first transfer transistor PG1 and the gate of the second transfer transistor PG2. The first metal layer may be formed on the first interlayer dielectric layer 401; and electrically connect with the gate of the first transfer transistor PG1 and the gate of the second transfer transistor PG2 through a plurality of first conductive vias. Referring to FIG. 1, the word lines WL illustrated in FIG. 2 and FIG. 5 may be simplified as one word line WL illustrated in FIGS. 3-4.

Further, in one embodiment, the word line WL may extend along a first direction. The first direction may refer to the x-axis direction shown in FIG. 4.

Further, referring to FIG. 4, the first metal layer may also include a plurality of transfer metal layers (in the edge regions of FIG. 4, not labeled). The transfer metal layers may be configured to transfer the first conductive vias to pre-determined positions. Since the first conductive vias may electrically with the second port of the first transfer transistor PG1, the second port of the second transfer transistor PG2, the source of the first pull-up transistor PU1, the source of the second pull-up transistor PU2, the source of the first pull-down transistor PD1 and the source of the second pull-down transistor PD2, when a second metal layer is subsequently formed to electrically connect with the transfer metal layers, the second metal layer may electrically connect with the second port of the first transfer transistor PG1, the second port of the second transfer transistor PG2, the source of the first pull-up transistor PU1, the source of the second pull-up transistor PU2, the source of the first pull-down transistor PD1 and the source of the second pull-down transistor PD2.

A process for forming the first metal layer having the word line WL and the transfer metal layers may include depositing a metal thin film, performing a photolithography process and etching the metal thin film to form the word line WL and the transfer metal layers. The metal thin film may be formed by a CVD process, a PVD process, or a sputtering process, etc. The metal thin film may be etched by a dry etching process, a wet etching process, or an ion beam etching process, etc. In certain other embodiments, the first metal layer may be formed by a lift-off process.

Returning to FIG. 6, after forming the first metal layer, a second interlayer dielectric layer may be formed (S105). The corresponding semiconductor may refer to FIG. 4.

As shown in FIG. 4, a second interlayer dielectric layer 402 is formed. The second interlayer dielectric layer 402 may cover the first interlayer dielectric layer 401 and the first metal layer.

The second interlayer dielectric layer 402 may be made of any appropriate material, such as silicon oxide, silicon nitride, silicon oxynitride, or low-K material, etc. Various processes may be used to form the second interlayer dielectric layer 402, such as a CVD process, a PVD process, or an FCVD process, etc.

Returning to FIG. 6, after forming the second interlayer dielectric layer 402, a plurality of second openings (not shown) may be formed in the second interlayer dielectric layer 402 (S106). The second openings may expose the transfer metal layers. Various processes may be used to form the second openings, such as a dry etching process, a wet etching process, or an ion beam etching process, etc.

Returning to FIG. 6, after forming the second openings in the second interlayer dielectric layer 402, a second conductive via (not labeled) may be formed in each of the second openings (S106). The corresponding semiconductor structure may refer to FIG. 4.

The second conductive vias may be through the second interlayer dielectric layer 402 and electrically connect with the metal transfer layers. Therefore, the second conductive vias may electrically connect with the second port of the first transfer transistor PG1, the second port of the second transfer transistor PG2, the source of the first pull-up transistor PU1, the source of the second pull-up transistor PU2, the source of the first pull-down transistor PD1 and the source of the second pull-down transistor PD2 through the second conductive vias.

The second conductive vias may be made of any appropriate material, such as Cu, or Al, etc. Various processes may be used to form the second conductive via, such as a CVD process, a PVD process, an FCVD process, a sputtering process, or an electroplating process, etc.

Returning to FIG. 6, after forming the second conductive vias, a second metal layer (not labeled) may be formed on the second interlayer dielectric layer 402 (S107). The corresponding semiconductor structure may refer to FIG. 4.

As shown in FIG. 4, the second metal layer (the blank patterns) may include the first bit line BL1, the second bit line BL2, the first power source line Vdd and the second power sources lines Vss. The first bit line BL1 may electrically connect with the second port of the first transfer transistor PG1 through the second conductive vias. The second bit line BL2 may electrically connect with the second port of the second transfer transistor PG2 through the second conductive vias. The first power source line Vdd may electrically connect with the source of the first pull-up transistor PU1 and the source of the second pull-up transistor PU2 through the second conductive vias. The second power source lines Vss may electrically connect with the source of the first pull-down transistor PD1 and the source of the second pull-down transistor PD2, respectively. As used herein, the second port of the first transfer transistor PG1 and the second port of the second transfer transistor may refer to the source region or the drain region of the first transfer transistor PG1 and the second transfer transistor PG2, respectively.

The first bit line BL1, the second bit line BL2, the first power source line Vdd and the second power source lines Vss may extend along a second direction. In one embodiment, the second direction may refer to the y-axis direction shown in FIG. 4. That is, the second direction may be perpendicular to the first direction, e.g., the extending direction of the word line WL. In certain other embodiments, the first direction and the second direction may have any appropriate angle.

Comparing with the existing SRAM, the layout-design of the first metal layer and the second metal layer of the disclosed SRAM may be changed. Referring to FIG. 4, the word line WL may be formed in the first metal layer; and the first bit line BL1, the second bit line BL2, the first power source line Vdd and the second power source lines Vss may be formed in the second metal layer, thus the minimum feature size of the patterns in the first metal layer may be increased. For example, for a SRAM with a 20 nm technology node, the minimum feature size of the first metal layer may be approximately 0.0057 $\mu m^2$. Further, the minimum pitch size may also be increased.

For example, for a SRAM with a 20 nm technology node, the pitch size of the patterns in the second metal layer may be approximately 115 nm. Therefore, the difficulty for the photolithography process in a fabrication process of a SRAM may be reduced; and the complexity of the fabrication process of a SRAM may be reduced as well.

Therefore, a SRAM may be formed by the above disclosed methods and processes; and a corresponding SRAM may refer to FIG. 4 and FIG. 5. The SRAM includes a semiconductor substrate and a first pull-up transistor PU1, a second pull-up transistor PU2, a first pull-down transistor PD1, a second pull-down transistor PD2, a first transfer transistor PG1 and a second transfer transistor PG2 formed on the semiconductor substrate.

The SRAM also includes a first interlayer dielectric layer 401 covering the first pull-up transistor PU1, the second pull-up transistor PU2, the first pull-down transistor PD1, the second pull-down transistor PD2, the first transfer transistor PG1 and the second transfer transistor PG2; a plurality of first conductive vias formed in the first interlayer dielectric layer 401 and electrically connecting with the gate of the first transfer transistor PG1 and the gate of the second transfer transistor PG2; and a first metal layer having a word line WL electrically connecting with the first conductive vias.

Further, the SRAM includes a second interlayer dielectric layer 402 covering the first interlayer dielectric layer 401 and the first metal layer; a plurality of the second conductive vias formed in the second interlayer dielectric layer 402 and electrically connecting with the second port of the first transfer transistor PG1, the second port of the second transfer transistor PG2, the source of the first pull-up transistor PU1, the source of the second pull-up transistor PU2, the source of the first pull-down transistor PD1 and the source of the second pull-down transistor PD2; and a second metal layer having a first bit line BL1, a second bit line BL2, a first power source line Vdd and second power source lines Vss electrically connecting with the second conductive vias.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a static random access memory, comprising:
providing a semiconductor substrate;
forming a plurality of transistors on the semiconductor substrate, the plurality of transistors comprising a first pull-up transistor, a first pull-down transistor, a second pull-up transistor, a second pull-down transistor, a first transfer transistor, and a second transfer transistor;
forming a single layer of a first interlayer dielectric layer covering the plurality of transistors;
forming a plurality of openings only in the first interlayer dielectric layer to expose at least a gate of the first transfer transistor and a gate of the second transfer transistor;
forming a first conductive via in each of the first openings in the first interlayer dielectric layer, the first conductive via being a single layer structure passing through the single layer of the first interlayer dielectric layer;
forming a first metal layer over the first interlayer dielectric layer, the first metal layer comprising a word line electrically connecting the gate of the first transfer transistor and the gate of the second transfer transistor through the single layer structure of the first conductive via only passing through the single layer of the first interlayer dielectric layer;
forming a second interlayer dielectric layer covering the first interlayer dielectric layer and the first metal layer; and
forming a second metal layer over the second interlayer dielectric layer, the second metal layer comprising a first bit line, a second bit line, a first power source line and a second power source line electrically connecting with each of the plurality of the transistors via second conductive vias passing through the second interlayer dielectric layer.

2. The method according to claim 1, wherein:
the word line electrically connects with a gate of the first transfer transistor and a gate of the second transfer transistor.

3. The method according to claim 1, wherein:
the first bit line electrically connects with a second port of the first transfer transistor;
the second bit line electrically connects with the second port of the second transfer transistor;
the first power source line electrically connects with a source of the first pull-up transistor and a source of the second pull-up transistor; and
the second power source lines electrically connects with a source of the first pull-down transistor and the source of the second pull-down transistor.

4. The method according to claim 1, wherein:
a gate of the first pull-up transistor electrically connects with a gate of the first pull-down transistor;
a gate of the second pull-up transistor electrically connects with a gate of the second pull-down transistor;
a first port of the first transfer transistor electrically connects with a drain of the first pull-up transistor and a drain of the first pull-down transistor; and
a first port of the second transfer transistor electrically connects with a drain of the second pull-up transistor and a drain of the second pull-down transistor.

5. The method according to claim 1, before forming the second metal layer, further including:

forming a plurality of second openings exposing a second port of the first transfer transistor, a second port of the second transfer transistor, a source of the first pull-up transistor, a source of the first pull-down transistor, a source of the second pull-up transistor and a source of the second pull-down transistor; and
forming a second conductive via in each of the second openings.

6. The method according to claim 1, wherein:
the first pull-up transistor and the first pull-down transistor have a same gate; and
the second pull-up transistor and the second pull-down transistor have a same gate.

7. The method according to claim 1, wherein:
the first transfer transistor and the first pull-down transistor are in a same active region; and
the second transfer transistor and the second pull-down transistor are in a same active region.

8. The method according to claim 1, wherein:
the first pull-up transistor and the second pull-up transistor are PMOS transistors; and
the first pull-down transistor, the second pull-down transistor, the first transfer transistor and the second transfer transistor are NMOS transistors.

9. A static random access memory, comprising:
a semiconductor substrate;
a plurality of transistors formed on the semiconductor substrate, the plurality of transistors comprising a first pull-up transistor, a first pull-down transistor, a second pull-up transistor, a second pull-down transistor, a first transfer transistor, and a second transfer transistor;
a single layer of a first interlayer dielectric layer covering the plurality of transistors;
a first metal layer over the first interlayer dielectric layer, the first metal layer comprising a word line electrically connecting with a first conductive via only passing through the single layer of the first interlayer dielectric layer, wherein the first conductive via is a single layer structure passing through the single layer of the first interlayer dielectric layer, and the word line is connected with a gate of the first transfer transistor and a gate of the second transfer transistor through the single layer structure of the first conductive via, respectively;
a second interlayer dielectric layer covering the first interlayer dielectric layer and the first metal layer; and
a second metal layer over the second interlayer dielectric layer, the second metal layer comprising a first bit line, a second bit line, a first power source line and second power source lines electrically connecting with each of the plurality of the transistors via second conductive vias passing through the second interlayer dielectric layer.

10. The static random access memory according to claim 9, wherein:
the first bit line electrically connects with a second port of the first transfer transistor;
the second bit line electrically connecting with a second port of the second transfer transistor;
the first power source line electrically connects with a source of the first pull-up transistor and a source of the second pull-up transistor; and
the second power source lines electrically connect with a source of the first pull-down transistor and a source of the second pull-down transistor.

11. The static random access memory according to claim 9, wherein:

the word line electrically connects with a gate of the first transfer transistor and a gate of the second transfer transistor.

12. The static random access memory according to claim 9, wherein:
   a gate of the first pull-up transistor electrically connects with a gate of the first pull-down transistor;
   a gate of the second pull-up transistor electrically connects with a gate of the second pull-down transistor;
   a first port of the first transfer transistor electrically connects with a drain of the first pull-up transistor and a drain of the first pull-down transistor; and
   a first port of the second transfer transistor electrically connects with a drain of the second pull-up transistor and the drain of the second pull-down transistor.

13. The static random access memory according to claim 9, wherein:
   the second conductive vias electrically connect with a second port of the first transfer gate, the second port of the second transfer gate, a source of the first pull-up transistor, a source of the second pull-up transistor, a source of the first pull-down transistor and a source of the second pull-down transistor.

14. The static random access memory according to claim 9, wherein the first metal layer further includes:
   a plurality of transfer layers configured to transfer the first conductive vias to pre-determined positions.

15. The static random access memory according to claim 9, wherein:
   the first pull-up transistor and the second pull-up transistor are PMOS transistors; and
   the first pull-down transistor, the second pull-down transistor, the first transfer transistor and the second transfer transistor are NMOS transistor.

16. The static random access memory according to claim 9, further including:
   a first storage node; and
   a second storage node.

17. The method according to claim 1, wherein, under a top view of the static random access memory, a length direction of the word line is perpendicular to a length direction of the first power source line and the second power source line.

18. The static random access memory according to claim 9, wherein, under a top view of the static random access memory, a length direction of the word line is perpendicular to a length direction of the first power source line and the second power source line.

* * * * *